(12) United States Patent
Henzler et al.

(10) Patent No.: US 7,471,580 B2
(45) Date of Patent: Dec. 30, 2008

(54) FLIP-FLOP WITH ADDITIONAL STATE STORAGE IN THE EVENT OF TURN-OFF

(75) Inventors: Stephan Henzler, München (DE); Joerg Berthold, München (DE); Georg Georgakos, Fraunberg (DE); Doris Schmitt-Landsiedel, Ottobrunn (DE); Christian Pacha, München (DE)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 11/274,048

(22) Filed: Nov. 15, 2005

(65) Prior Publication Data

US 2006/0119406 A1   Jun. 8, 2006

(30) Foreign Application Priority Data

Nov. 15, 2004   (DE) .................. 10 2004 055 006

(51) Int. Cl.
*G11C 7/02* (2006.01)
(52) U.S. Cl. .................. 365/207; 365/154; 365/149
(58) Field of Classification Search .................. 365/207, 365/154, 149
See application file for complete search history.

(56) References Cited

U.S. PATENT DOCUMENTS

| 4,435,793 | A | * | 3/1984 | Ochii .................. 365/233 |
|---|---|---|---|---|
| 4,703,456 | A | * | 10/1987 | Arakawa .................. 365/185.08 |
| 4,809,225 | A | | 2/1989 | Dimmler et al. |
| 5,473,571 | A | | 12/1995 | Shigematsu et al. |
| 5,781,627 | A | * | 7/1998 | Ikuta et al. .................. 711/163 |
| 6,707,702 | B1 | * | 3/2004 | Komatsuzaki .................. 365/145 |
| 2003/0185040 | A1 | | 10/2003 | Rickes et al. |
| 2003/0188241 | A1 | | 10/2003 | Zyuban et al. |
| 2004/0051574 | A1 | | 3/2004 | Ko et al. |

FOREIGN PATENT DOCUMENTS

DE        3886600        7/1994

OTHER PUBLICATIONS

Shin'Ichiro Mutoh et al., "1-V Power Supply High-Speed Digital Circuit Technology with Multithreshold-Voltage CMOS", IEEE Journal of Solid-State Circuits, vol. 30, No. 8, Aug. 1995, pp. 847-854.
Borivoje Nikolic et al., "Improved Sense-Amplifier-Based Filp-Flop: Design and Measurements", IEEE Journal of Solid-State Circuits, vol. 35, No. 6, Jun. 2000, pp. 876-884.

* cited by examiner

*Primary Examiner*—Huan Hoang
(74) *Attorney, Agent, or Firm*—Patterson & Sheridan, L.L.P.

(57) ABSTRACT

The flip-flop according to the invention serves for storing an item of logic state information and has at least one data input and at least one data output. The flip-flop comprises at least one latch stage for storing the state information if the flip-flop is switched on. Furthermore, the flip-flop according to the invention comprises at least one memory cell having a capacitance as storage element. In this case, the at least one memory cell serves for storing the state information if the flip-flop is switched off.

14 Claims, 8 Drawing Sheets

FLIP-FLOP WITH ADDITIONAL STATE STORAGE IN THE EVENT OF TURN-OFF

CROSS-REFERENCE TO RELATED APPLICATIONS

This application claims foreign priority benefits under 35 U.S.C. §119 to co-pending German patent application number DE 10 2004 055 006.9, filed 15 Nov. 2004. This related patent application is herein incorporated by reference in its entirety.

BACKGROUND OF THE INVENTION

1. Field of the Invention

The invention relates to a flip-flop for storing logic state information in a circuit block, which retains the state information when the flip-flop and the surrounding circuit block are turned off.

2. Description of the Related Art

In order to reduce the power loss of a system, it is known to turn off circuit blocks, in particular logic blocks, which are temporarily not required for the function of the system. In general, the respective circuit block is turned off by decoupling the circuit block from the supply voltage. In order to isolate the respective circuit block from the negative pole (VSS; e.g. 0 V) of the supply voltage, a large N-MOS transistor (N-MOS power switch) is used, which is arranged between the VSS node and the block-internal supply terminal (VVSS—virtual VSS). As an alternative, the respective circuit block can be isolated from the positive pole (VDD; e.g. 1.2 V) of the supply voltage, a large P-MOS transistor (P-MOS power switch) being used in this case, which is connected between the VDD node and the block-internal supply terminal (VVDD—virtual VDD). The prior art also describes combined methods which use both P-MOS and N-MOS power switches within the same circuit block. The block-internal supply potentials VVDD and VVSS are also referred to as virtual supply potentials. Turning off circuit blocks in this way is known in the prior art by the terms "Multiple Threshold CMOS" (MTCMOS), "Circuit Block Switch-off" (CB-SO) or "Sleep Transistor Technique".

If an N-MOS or P-MOS power switch, which is also referred to as "Cut Off Transistor", "Sleep Transistor", "Footer" or "Header" in the prior art, is turned off, the leakage currents charge the internal capacitances until the potential of all the signal nodes within the turned-off circuit block and the potential of the block-internal VVSS or VVDD node has reached a value near the potential of the non-connected pole of the supply voltage (i.e. VDD or VSS). The voltage across the switched-off circuit block collapses in this way.

What is disadvantageous about the turn-off of a circuit block is that circuit parts situated within the circuit block that effect storage, such as, for example, flip-flops, memory cells or memory arrays, lose their storage content after the turn-off. At the system level, therefore, it is necessary to decide whether these storage contents are irrelevant and their loss due to the turn-off can be accepted, or whether the storage contents and thus the state of the relevant circuit block must be maintained. In the latter case, the corresponding storage contents can be swapped into a block-external memory that is not turned off, for example an SRAM (static random access memory). As an alternative, special flip-flops whose storage state is not lost due to the turn-off may be used within the circuit block to be turned off. Flip-flops of this type are also referred to as state retention flip-flops. The use of state retention flip-flops is preferable to a SRAM-based solution since the latter is associated with a significantly increased power loss consumption and a latency for swapping and loading the storage contents.

Various forms of implementation of state retention flip-flops are described in the documents "1-V Power Supply High-Speed Digital Circuit Technology with Multithreshold-Voltage CMOS", Mutoh et al., IEEE JSSC, Vol. 30., No. 8., August 1995; U.S. Pat. No. 5,473,571; US 2003/0188241 and US 2004/051574. These forms of implementation of a state retention flip-flop that are known from the prior art are based on the use of an additional latch stage for storing the data in the event of the circuit block being turned off, which is situated either in the data path of the flip-flop or in a path in parallel therewith. This additional latch stage is also referred to as "Shadow Latch" or "Balloon Latch". In the case of a shadow latch of this type, so-called thick oxide MOS transistors (that is to say with a thick oxide for reducing the gate tunnelling current) in conjunction with a high threshold voltage are used for reducing the leakage currents. When the voltage supply of the circuit block is turned off, the voltage supply of the shadow latch is maintained. For this purpose, the shadow latch is connected to the VDD node instead of the VVDD node or to the VSS node instead of the VVSS node.

What is disadvantageous about forms of implementation of a state retention flip-flop that are known from the prior art is that such state retention flip-flops within a circuit block have to be supplied not with two supply potentials but rather with at least three supply potentials, namely with the virtual supply potential VVDD or VVSS and the two non-connected supply potentials VDD and VSS. In a full custom design, the outlay for this can be handled, in principle, by means of skilful positioning of the flip-flops. By contrast, the additional outlay on account of the third supply potential is considerable in the case of an automatic, computer-aided circuit block synthesis by means of a so-called place-and-route tool. In order to supply the shadow latch stages with the additional supply potential, it is necessary in this case generally to provide an additional, third supply rail in the layout of all the standard cells of a circuit block that can be turned off, said third supply rail leading through all the standard cells. FIG. 1 shows by way of example a standard cell of this type, having besides a VDD rail and a VVSS rail in addition a VSS rail as third supply rail for supplying the shadow latch stage. In view of the limited number of metallization planes, considerable limitations for the remaining wiring result on account of the additional supply rail. Moreover, further disadvantages for the layout result form the use of the additional supply potential; by way of example, a well isolation is required in the layout. A further problem results from the fact that the nodes between the turned-off circuit parts and the shadow latch have a non-defined, floating potential, which would lead to high short-circuit currents into the shadow latch. For this reason, the shadow latch is normally isolated from the rest of the circuit by so-called transmission gates. The driving of the transmission gates requires two further control signals which have to be additionally fed to the flip-flop, which is associated with further outlay in the layout. In addition, these signals must also be valid in the turned-off state of the circuit block, that is to say that the gates which generate these signals have to be supplied, like the shadow latch, likewise by the supply potential that is not turned off.

SUMMARY OF THE INVENTION

Therefore, it is an object of the invention to specify an alternative state retention flip-flop which requires a lower layout outlay in comparison with the prior art, in particular with regard to the voltage supply and driving with control signals.

The flip-flip according to the invention according to one embodiment serves for storing an item of logic state information and has at least one data input and at least one data output. The flip-flop comprises at least one latch stage for storing the state information if the flip-flop is switched on. Furthermore, the flip-flop according to the invention comprises at least one memory cell having a capacitance as storage element. In this case, the at least one memory cell serves for storing the state information if the flip-flip is switched off.

The flip-flop according to the invention is based on the insight that when circuit blocks are turned off, in most applications the respective circuit block is only switched off for a limited period of time. Consequently, it is not necessary to ensure an infinitely long availability of the turned-off state information after the circuit blocks have been switched off. This is because, on the basis of the system specification, the time duration for which a specific circuit block is not required is often known. In other applications, the statistical capacity utilization of specific circuit blocks is known. Accordingly, it is generally sufficient for the state information that is present directly before the switch-off instant to be retained only for a limited time duration, for example merely for a few milliseconds.

Proceeding from this insight, the state retention flip-flop according to the invention is based not on a static storage concept (on the basis of a positive feedback bistable multivibrator) but rather on a dynamic storage concept—having a capacitance as storage element—for preserving the state information in the event of switch-off. The fact that the use of a capacitance as storage element can ensure the preservation of the state information only for a limited time duration after the flip-flop is switched off is not restrictive—as explained above—for most applications. This limited time duration in which the state information is maintained is also referred to as the retention time. The use of a dynamic storage concept instead of a static storage concept results in simplifications in the layout and the circuit structure of the flip-flop and the surrounding circuit block.

The flip-flop in accordance with one embodiment may be a flip-flop which is temporarily transparent between data input and data output and which is often also referred to as a latch, or a non-transparent master-slave flip-flop (if the flip-flop comprises two latch stages).

The term latch stage may include various digital storage means in the sense of the application: on the one hand static storage means such as bistable positive feedback multivibrators, in particular positive feedback sense amplifiers, on the other hand also dynamic storage means which are used in dynamic flip-flop concepts.

The flip-flop can be switched off in different ways in the sense of the invention. By way of example, current sources present in the flip-flop could be switched off, so that the storage function of the latch stage is lost.

Preferably, by contrast, the flip-flop is isolated from the supply voltage for the switch-off. In the case of the flip-flop according to the invention, in contrast to the prior art, it is not necessary to provide a further supply potential which only serves for supplying the state-retaining memory cell in the switched-off state of the flip-flop. In the case of a fully automatic design of a circuit block, therefore, it is possible for flip-flops of this type to be positioned arbitrarily without having to provide an additional supply rail in the layout.

Preferably, the at least one memory cell is based on a DRAM memory cell, in particular a 2- or 3- transistor DRAM memory cell.

According to one advantageous embodiment, the at least one memory cell comprises, in addition to the capacitance, a MOS coupling transistor, which can be switched by means of a first control signal. In a manner dependent on the first control signal, the coupling transistor either connects the capacitance to the data input or decouples the capacitance from the data input. Furthermore, the memory cell comprises a MOS storage transistor driven via the capacitance. In this case, the MOS coupling transistor and the MOS storage transistor correspond to the input-side coupling transistor and storage transistor, respectively, in a DRAM memory cell. Instead of two control signals as in the prior art, the flip-flop according to the invention requires only one control signal, namely the first control signal, for controlling the memory cell.

In this case, it is advantageous if the first control signal is dependent on a second control signal. In this case, the second control signal serves for switching the flip-flop on and off, for example by driving an N- or P-MOS power switch. In this case, the first control signal is dependent on the second control signal in such a way that, in a manner controlled by means of the first control signal, the capacitance is electrically decoupled from the data input if the flip-flop is switched off by means of the second control signal. The capacitance thus holds the state information if the flip-flop is switched off.

It is advantageous if the coupling transistor and/or the storage transistor are so-called thick oxide MOS transistors. In this case, thick oxide MOS transistors have an increased oxide thickness in comparison with thin oxide MOS transistors, for example 5.2 nm (thick oxide) in comparison with 2.2 nm (thin oxide) in the case of the CMOS8 process of the company IBM with a structure resolution of 0.13 µm. The use of thick oxide MOS transistors increases the retention time, that is to say the maximum possible time duration of state storage. This is physically attributable to the fact that the gate tunnelling currents via the gate oxide are very small in the case of transistors with a thick gate oxide, so that the capacitance in the memory cell is subjected to charge reversal only very slowly on account of gate leakage currents.

Furthermore, it is advantageous if the coupling transistor is a so-called high Vt transistor. A high Vt transistor has an increased threshold voltage. The higher threshold voltage has the effect that the subthreshold current of the coupling transistor is lower and the retention time is thus longer.

Moreover, it is advantageous if the coupling transistor and the storage transistor are P-MOS transistors. P-MOS transistors generally have lower gate tunnelling currents in comparison with N-MOS transistors, so that the retention time is increased by the use of P-MOS transistors in a similar manner to by the use of thick oxide MOS transistors. Therefore, thick oxide P-MOS transistors are optimally used as the coupling transistor and storage transistor. The use of P-MOS transistors is additionally advantageous when the circuit block and also the flip-flops contained therein are turned off by disconnection of the VSS potential. In this case, the non-connected VDD supply potential is available for the turn-off of the P-MOS transistors in each cell.

According to one advantageous embodiment of the flip-flop according to the invention, the first control signal drives the gate terminal of the coupling transistor. If a P-MOS transistor is used as the coupling transistor, the first control signal, while the capacitance is electrically coupled to the data input, is advantageously at least temporarily less than the VSS potential. If an N-MOS transistor is used as the coupling transistor, the first control signal, while the capacitance is electrically coupled to the data input, is advantageously at least temporarily greater than the VDD potential. Such driving of the gate terminal with a gate potential greater than VDD or less than VSS is also referred to as "boosting". The advantage of boosting is that the storage capacitance can be subjected to charge reversal completely between the VDD potential and the VSS potential, since a voltage drop across the coupling transistor that is governed by the finite threshold voltage is reduced or even virtually completely avoided. Moreover, the switching resistance $R_{on}$ of the coupling transistor during the read-in phase requires a very low value, so that the signal amplitude at the capacitance and thus the charge reversal of the capacitance become as large as possible. This in turn enables a high retention time.

As already described above, the flip-flop, if it is switched off, is advantageously isolated either from the positive pole (VDD) or the negative pole (VSS) of the supply voltage. When the switch-off is implemented in this way, it is advantageous if the capacitance in the memory cell is connected to the VSS terminal or to the VDD terminal of the supply voltage, that is to say that the capacitance is connected by its second terminal to the non-connected operating potential.

This measure prevents an increased leakage current and an unintentional activation of the coupling transistor. If, by way of example, when the flip-flop is switched off, it is disconnected from the VSS potential by an N-MOS power switch, the virtual VVSS terminal drifts in the direction of the VDD potential. If the capacitance is connected by its second terminal to the VVSS terminal instead of to the VDD terminal, the potential of the storage node, that is to say the potential at the first terminal of the capacitance, drifts by the same magnitude, thus resulting in a potential elevation at the storage node (also referred to as "pushing"), as a result of which the leakage current of the P-MOS coupling transistor increases and the P-MOS coupling transistor is possibly even activated.

The latch stage is advantageously embodied using differential circuit technology. In this case, two memory cells are provided in the flip-flop, the two memory cells being driven complementarily with respect to one another via the data input. In this case, the memory cells are read differentially, thereby increasing the robustness of the flip-flop towards interference signals. In particular so-called soft errors caused by radiation, which are typical both of static and of dynamic storage concepts, are avoided to the greatest possible extent by virtue of the differential circuit concept of the flip-flop. It holds true in this case that the flip-flop according to the invention is generally, that is to say also in a non-differential embodiment, less sensitive towards radiation since only one radiation-sensitive pn junction is present at the storage node, whereas 4 to 8 pn junctions are present at the storage nodes in the case of state retention flip-flops known from the prior art. The differential storage concept additionally serves for increasing the retention time, since storage contents attenuated by leakage currents can be reliably read out over a longer period of time.

In principle, various concepts for state storage in the sense of the application are conceivable for the latch stage. A bistable multivibrator is often used as the latch stage, said bistable multivibrator comprising two cross-coupled inverters in its basic form and representing a static state memory. In addition, the latch stage may also be embodied as a dynamic latch stage, (parasitic) capacitances being used for storage in this case.

The latch stage of the flip-flop according to the invention is advantageously a positive feedback MOS sense amplifier. A MOS sense amplifier of this type enables a high sensitivity in the assessment of differential input signals. Flip-flops based on a MOS sense amplifier are also referred to as sense-amplifier-based flip-flops (SAFF) in the prior art. The document "Improved Sense-Amplifier-Based Flip-Flop: Design and Measurements", B. Nikolic et al., IEEE Journal of Solid-State Circuits, Vol. 35., No. 6 June 2000, gives an overview of flip-flops of this type. In the sense of the application, the provision of an additional second latch stage (slave latch), as described in this document, is not mandatory.

According to one advantageous embodiment, the flip-flop according to the invention comprises a multiplexer. The latter has two inputs and is connected on the input side both for receiving the signal at the data input of the flip-flop and for receiving the state information stored in the at least one memory cell. Furthermore, the multiplexer is connected on the output side to an input of the at least one memory cell. With the aid of a multiplexer, the state information stored in the memory cell can be refreshed again (memory refreshing) in a manner similar to that in the case of a DRAM memory device. If the storage content is intended to be refreshed again, the multiplexer is switched in such a way that the signal at the output of the memory cell is written back to the memory cell after corresponding signal regeneration. For this purpose, the multiplexer advantageously does not read out the signal directly at the output of the memory cell, but rather the signal at the output of a latch stage connected downstream of the memory cell, which signal is already regenerated when the flip-flop is switched on momentarily.

One development of the invention is directed at a monitor circuit in accordance with an embodiment for monitoring the discharge state of the capacitance of a flip-flop according to the invention. The monitor circuit comprises a monitor capacitance, the discharge time of which is characteristic of the discharge time of the capacitance provided in the memory cell. Furthermore, the monitor circuit outputs a monitoring signal dependent on the charge state of the monitor capacitance.

With the aid of the monitoring signal of the monitor circuit, it is possible to draw conclusions about the discharge state of the monitor capacitance and thus about the discharge state of a corresponding capacitance of a flip-flop according to the invention. The monitoring signal may be used for example for controlling the refresh of the state information. As an alternative, the monitoring signal can be used to ascertain whether an item of state information stored in the memory cell of a flip-flop is still valid.

According to one advantageous embodiment of the monitor circuit, the monitor circuit comprises a monitor memory cell identical to the memory cell used in the flip-flop, said monitor memory cell comprising the monitor capacitance mentioned above. By virtue of using identical memory cells, the circuitry of the monitor capacitance is also identical to the circuitry of the capacitance in the memory cell, so that the discharge behavior of the two capacitances is identical to the greatest possible extent. Furthermore, the monitor circuit comprises a means for generating a reference voltage, and a means for comparing the voltage across the monitor capacitance with the reference voltage. The means for comparing the two voltages supplies the monitoring signal in this case.

The circuit block according to the invention in accordance with an embodiment comprises a plurality of flip-flops having a multiplexer in the manner described above. Furthermore, the circuit block comprises a control circuit, which, by controlling the respective multiplexer, initiates a refresh of the stored state information in the respective memory cell for the plurality of flip-flops.

In this case, the state information can be refreshed at a specific, fixed temporal refresh rate, for example. As an alternative, a monitor circuit as described above may be provided for controlling the refresh, the monitoring signal of said monitor circuit driving the control circuit. Since the leakage currents and thus also the retention time are temperature- and batch-dependent, and this variability of the leakage currents and the retention time relates to the monitor circuit in the same way, however, the second alternative is preferable to the first-mentioned possibility.

The circuit block according to the invention in accordance with an embodiment comprises a plurality of flip-flops according to the invention. Furthermore, a monitor circuit as described above is provided in the circuit block. Moreover, the circuit block comprises an evaluation circuit, which decides, in a manner dependent on the monitoring signal, whether the state information stored in the memory cells is valid.

The circuit block according to the invention in accordance with an embodiment comprises a plurality of flip-flops according to the invention. Furthermore, a monitor circuit as described above is provided in the circuit block. Moreover, the circuit block comprises an additional memory for storing the state information stored in the memory cells in a manner dependent on the monitoring signal of the monitor circuit.

If the storage content of the switched-off memory cells threatens to be lost, for example in the case of an excessively long turn-off phase of the circuit block, this can be identified by means of the monitor circuit. In this case, the storage content of the memory cells can be swapped into the circuit-block-external, additional memory, for example an SRAM.

The method according to the invention in accordance with an embodiment is directed at refreshing the stored state information in each memory cell of a plurality of flip-flops with multiplexer according to the invention. A first step involves checking whether the stored state information needs to be refreshed. At this point in time, the flip-flops are switched off. If the stored state information is intended to be refreshed, the plurality of flip-flops are subsequently optionally switched on. This is necessary when the regeneration of the state information takes place within the flip-flops themselves. If a refresh of these items of state information is necessary, the stored state information is subsequently refreshed in each memory cell of the plurality of flip-flops. For the case where the plurality of flip-flops according to the invention have been switched on prior to the refresh, the flip-flops are subsequently switched off again.

In this case, as already described above, the check as to whether the stored state information needs to be refreshed may be effected on the basis of fixed temporal stipulations. As an alternative, a monitor circuit as described above may be provided for controlling the refresh, the monitoring signal of said monitor circuit driving the control circuit. As an alternative, the monitoring signal of a monitor circuit described above may be interrogated for the purposes of the check.

The method according to the invention in accordance with another embodiment serves for checking the validity of the state information stored in the memory cells of a plurality of flip-flops according to the invention. The monitoring signal of a monitor circuit as described above is interrogated for the purpose of checking the state information.

The method according to the invention in accordance with another embodiment is directed at storing the state information stored in the memory cells of a plurality of flip-flops according to the invention in an additional circuit-block-external memory. A first method step involves interrogating the monitoring signal of a monitor circuit as described above. Afterwards, the state information stored in the memory cells is stored in a manner dependent on the monitoring signal of the monitor circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The invention is explained in more detail below on the basis of a plurality of exemplary embodiments with reference to the drawings, in which.

DETAILED DESCRIPTION OF THE PREFERRED EMBODIMENT

Figure 1:
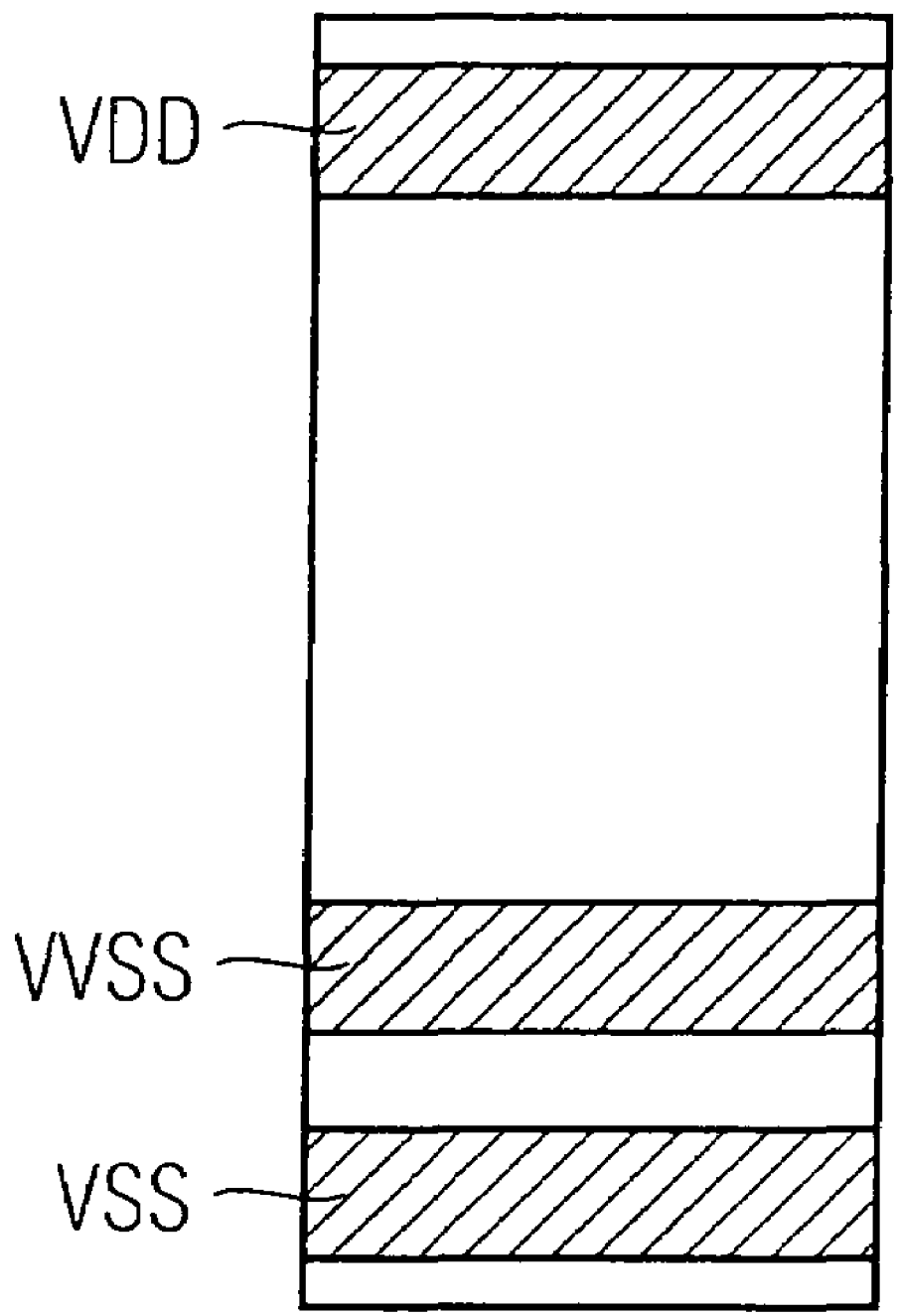
FIG. 1 shows a layout of the voltage supply of a standard cell in accordance with the prior art, which has, besides a VDD and VVSS rail, in addition a VSS rail for supplying the shadow latch stage.

With regard to FIG. 1 concerning the prior art, reference is made to the explanations in the introduction to the description.

Figure 2:
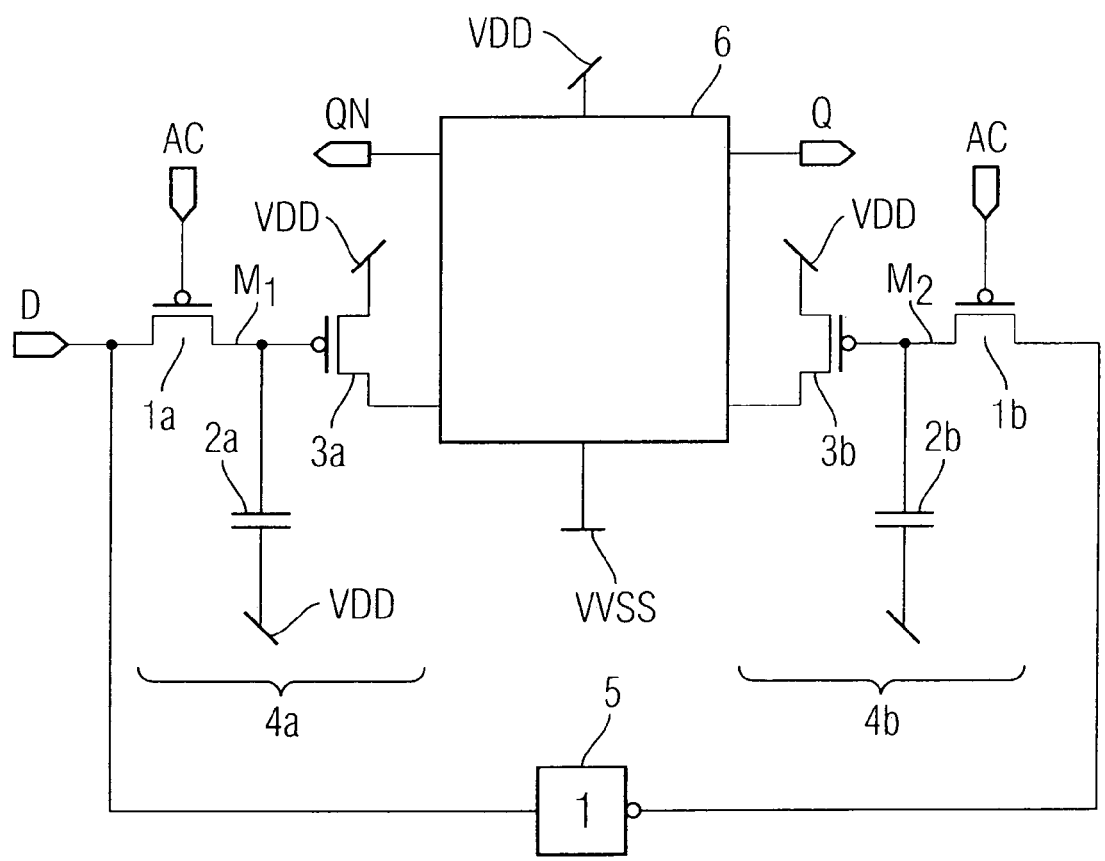
FIG. 2 shows a basic circuit diagram of an exemplary embodiment of a flip-flop according to the invention.

FIG. 2 illustrates a basic circuit diagram of an exemplary embodiment of an edge-triggered state retention flip-flop according to the invention, which can be used in a circuit block that can be turned off by means of an N-MOS power switch. As explained above, state retention flip-flops known from the prior art for state storage, in the turned-off state of the flip-flop, use an additional static latch stage which is continuously switched on. The differential state retention flip-flop according to the invention as illustrated in FIG. 2 is based, by contrast, on two dynamic memory cells $4a/4b$, each comprising a P-MOS coupling transistor $1a/1b$ a storage capacitance $2a/2b$ and a P-MOS storage transistor $3a/3b$. For the coupling transistors $1a/1b$ and the storage transistors $3a/3b$, use is preferably made of thick oxide transistors having at the same time a high threshold voltage, in order to achieve the longest possible retention time. Moreover, it is possible in this way largely to suppress currents via the gate terminal, so that the only leakage current path that has to be taken into consideration is the source subthreshold current of the coupling transistor 1a/1b.

With regard to the capacitances 2a and 2b, it is necessary to take into account that these should be dimensioned in such a way that the expected charge injection and also capacitive couplings do not completely toggle the storage content. A multiplicity of realizations are possible for the capacitances 2a and 2b; by way of example, they may be implemented as metal-metal capacitance, poly-poly capacitance, poly-metal capacitance, parasitic capacitance, MOS capacitance, arbitrary wiring capacitance, DRAM trench capacitance, DRAM stack capacitance, grid capacitance, capacitance on a second chip connected by flip-chip technology, well capacitance, etc.

The coupling transistors 1a and 1b are controlled by means of a control signal AC, the coupling transistors having low resistance for AC=VSS and having high resistance for AC=VDD. During active operation of the flip-flop, that is to say if the supply voltage is present at the flip-flop, the signal at the data input D is received by the first dynamic memory cell 4a for AC=VSS (coupling transistor 1a in the on state). In this case, the potential at the storage node $M_1$ follows the potential at the data input D. For the purpose of driving the second memory cell 4b, the signal at the data input D is firstly inverted by means of an inverter 5.

If the flip-flop is then switched off, the differential data signal is maintained for a short time across the capacitances 2a and 2b. In the switched-on state, the differential data signal present between the storage nodes $M_1$ and $M_2$ is fed via the storage transistors 3a and 3b into a differential sense amplifier 6 having a positive feedback. In this case, on account of the positive feedback, the sense amplifier 6 functions as a static latch stage of the flip-flop. Moreover, the state information stored in the dynamic memory cells can be detected with the aid of the sense amplifier 6. Furthermore, a further latch stage (not illustrated) may be provided on the output side of the sense amplifier 6, so that the flip-flop operates as a master-slave flip-flop. As an alternative to the sense amplifier 6, a simple comparator or differential amplifier may also be provided. In this case, however, at least one additional latch stage is necessary for state storage for the active operation of the flip-flop.

In the present case, in order to switch off the flip-flop, the flip-flop-internal negative supply potential VVSS is isolated from the supply potential VSS by means of a flip-flop-external N-MOS power switch (not illustrated). When the flip-flop is switched off, the virtual VVSS terminal drifts in the direction of the VDD potential. If the capacitances 2a and 2b are connected by their second terminal to the VVSS terminal instead of to the VDD terminal, the potential of the respective storage node $M_1$ or $M_2$ drifts by the same magnitude as the potential of the VVSS terminal, resulting in a potential elevation at the respective storage node $M_1$ or $M_2$. As a result, the leakage current of the respective P-MOS coupling transistor 1a or 1b increases; the respective P-MOS coupling transistor 1a or 1b is possibly even activated. In order to prevent this, the capacitances 2a and 2b are connected by their second terminal to the VDD potential instead of to the VVSS potential.

Figure 3A:
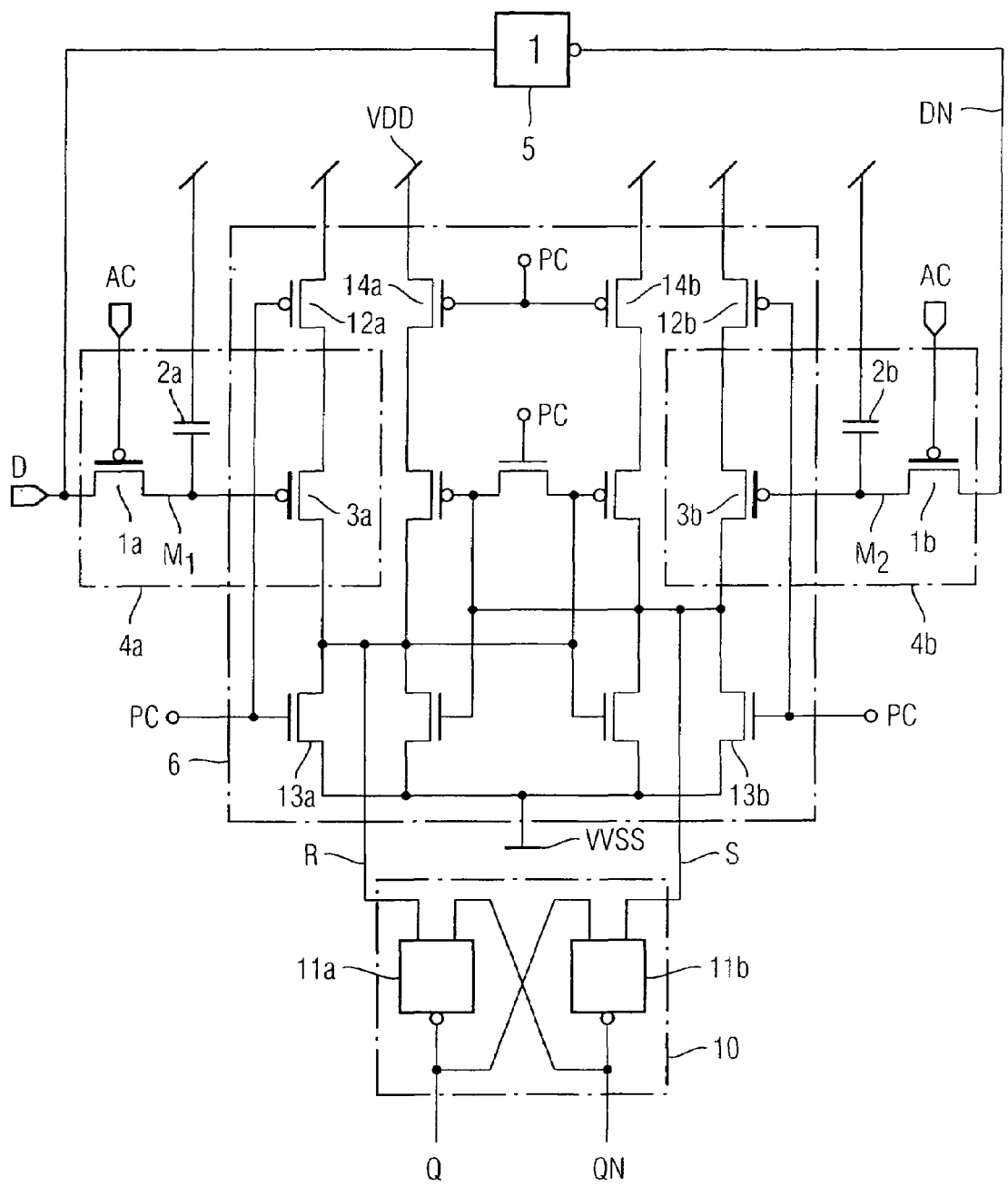
FIG. 3a shows a circuit diagram of a second exemplary embodiment of a flip-flop according to the invention (master-slave flip-flop) without the subcircuit for generating the control signals.

FIG. 3a illustrates a circuit diagram of a second exemplary embodiment of a flip-flop according to the invention. Circuit parts and signals provided with identical reference symbols in FIG. 2 and FIG. 3a correspond to one another. The flip-flop illustrated in FIG. 3a operates as a master-slave flip-flop. In the case of a master-slave flip-flop of this type, two latch stages are cascaded: the sense amplifier 6 and a NOR-RS latch stage 10 (RS—reset/set) comprising two NOR gates 11a and 11b.

In contrast to FIG. 2, the storage transistors 3a and 3b simultaneously also function as input transistors of the sense amplifier 6.

The sense amplifier 6 has two different operating modes: the precharge mode and the evaluate mode. In the precharge mode, the two outputs R (reset) and S (set) of the sense amplifier 6 are put at VSS independently of the data input signal of the sense amplifier 6. In the evaluate mode, the signal at the data input of the sense amplifier 6 is evaluated and forwarded to the output of the sense amplifier 6. The sense amplifier is controlled by means of the precharge signal PC (precharge).

The sense amplifier illustrated in FIG. 3a is characterized, in comparison with sense amplifiers known from the prior art, in that only 3 drain-source paths are arranged between VDD and VVSS, whereas in principle 4 drain-source paths are required in the prior art (in this respect, cf. for example the sense amplifier in the document "Improved Sense-Amplifier-Based Flip-Flop: Design and Measurements", B. Nikolic et al., IEEE Journal of Solid-State Circuits, Vol. 35., No. 6 June 2000). As a result, it is possible to realize a high switching speed even with a reduced supply voltage. Moreover, the structure of the sense amplifier illustrated in FIG. 3a is reversed compared with sense amplifiers known from the prior art, that is to say that N-MOS transistors are used instead of P-MOS transistors, and vice versa. This is favourable in view of the structure of the memory cells 4a and 4b (use of P-MOS coupling transistors).

Figure 4A:
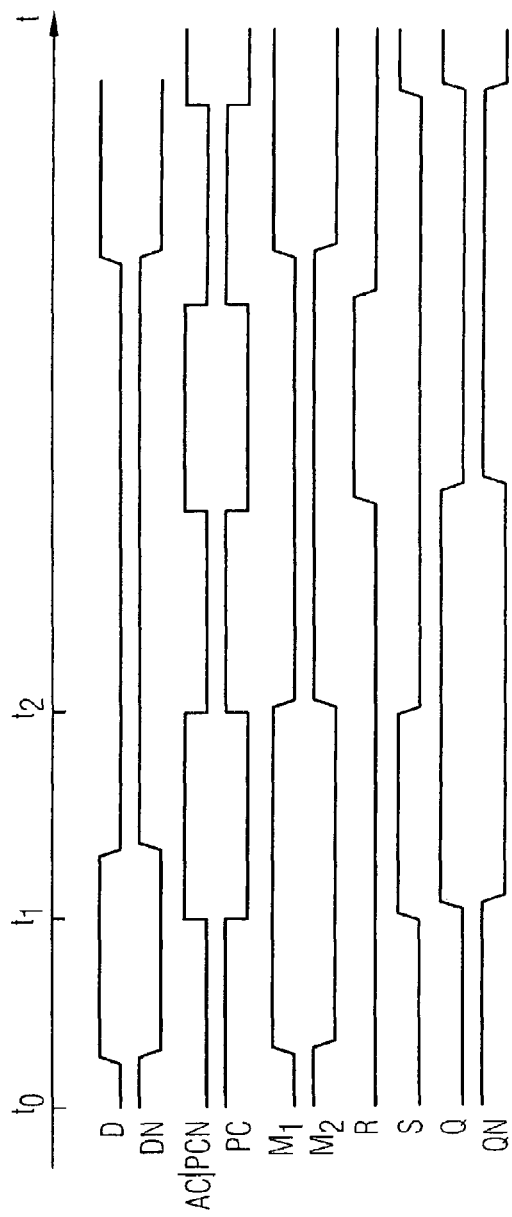
FIG. 4a shows a signal diagram for the flip-flop in accordance with FIG. 3a during active operation of the flip-flop.

The functioning of the flip-flop illustrated in FIG. 3a for active operation is described below with reference to the signal diagram illustrated in FIG. 4a. It should be pointed out that possible boosting of the control signal AC is not taken into account in the functional description below.

At the instant $t_0$, the control signal AC is at VSS, so that the P-MOS coupling transistors 1a and 1b are at low resistance. Accordingly, the potential of the storage nodes $M_1$ and $M_2$ at the capacitances 2a and 2b, respectively, follows the signal at the data input D and at the inverted data input DN, respectively. At this instant, the precharge signal PC is furthermore at VDD (precharge mode), so that the P-MOS transistors 12a and 12b are turned off, while the N-MOS transistors 13a and 13b are in the on state. Accordingly, the output nodes R and S of the sense amplifier 6 are at VSS. With this driving, the RS latch stage 10 retains its previous storage content.

At the instant $t_1$, the control signal AC is changed over to VDD, so that the coupling transistors 1a and 1b are turned off and the storage nodes $M_1$ and $M_2$ are decoupled from the data input D and inverted data input DN, respectively. At the same time, the precharge signal PC is changed over from VDD to VSS (evaluate mode), so that the transistors 12a and 12b and also 14a and 14b are in the on state, while the transistors 13a and 13b are turned off. At this instant, the sense amplifier detects the differential signal present at the storage nodes $M_1$ and $M_2$. In the present case, the node $M_1$ is at VDD and the node $M_2$ is at VSS, so that the transistor 3a is turned off, while the transistor 3b is in the on state. As a result, the potential of the node S changes from VSS to VDD, while the potential of the node R remains at VSS. The potential of the node S thus corresponds to the signal at the data input D, while the potential of the node R corresponds to the signal at the inverted data input DN. Since the signal at the node S corresponds to the set signal of an RS latch stage, the output Q of the RS latch stage 10 is furthermore set to VDD.

On account of the positive feedback of the sense amplifier 6, the potentials of the nodes R and S are held until the instant $t_2$. At the instant $t_2$, the precharge signal PC changes from VSS to VDD, so that the sense amplifier 6 is operated in the precharge mode again. The potentials at the nodes R and S are therefore put at VSS. On account of the positive feedback of the RS latch stage 10, the signals at the outputs Q and QN are held on the part of the RS latch stage 10. In this phase, therefore, the RS latch stage 10 is responsible for the state storage. At the same time, the potential of the storage nodes $M_1$ and $M_2$ follows the signal at the data input D and at the inverted data input DN, respectively, in the manner already described.

The functioning of the flip-flop illustrated in FIG. 3a in the case of the flip-flop being switched off and in the case of the subsequent reactivation of the flip-flop is described below with reference to the signal diagram illustrated in FIG. 4b.

The signal sel corresponds to the control signal of the N-MOS power switch. If the control signal sel is at VDD, the flip-flop and the circuit block surrounding the flip-flop are activated, while the flip-flop and the circuit block surrounding the flip-flop are switched off if the signal sel is at VSS. As soon as the signal sel is at VSS, that is to say the flip-flop is switched off, the control signal AC, in contrast to FIG. 4a (active operation), no longer follows the inverted precharge signal PCN (clock signal), but rather has the value VDD in constant fashion.

Figure 4B:
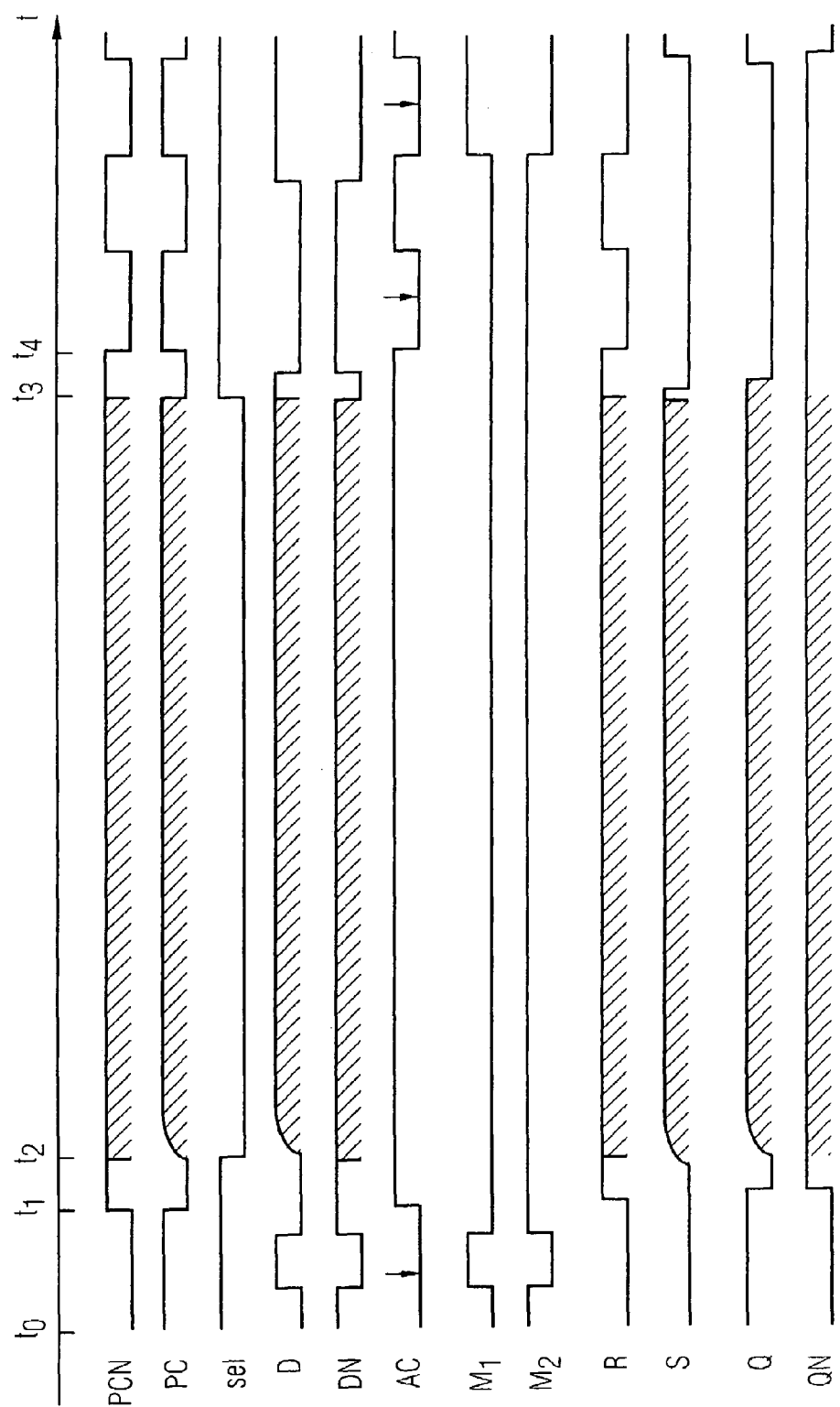
FIG. 4b shows a signal diagram for the flip-flop in accordance with FIG. 3a in the case of turn-off and reactivation of the flip-flop.

Hatched regions of the signal profiles illustrated in FIG. 4b indicate that the corresponding signal is invalid or not defined (floating) at this instant.

At the instant $t_0$, the control signal sel is at VDD, that is to say that the flip-flop is in active operation at this instant. At the same time, the precharge signal PC has the potential VDD. The sense amplifier 6 is thus in the precharge mode. Moreover, the control signal AC is at VSS, so that the potential of the storage nodes $M_1$ and $M_2$ follows the potential at the data input D and the potential at the inverted data input DN, respectively.

At the instant $t_1$, the precharge signal PC changes from VDD to VSS, so that the storage nodes $M_1$ and $M_2$ are decoupled from the data input D and inverted data input DN, respectively. At the same time, the sense amplifier 6 changes from the precharge mode to the evaluate mode, in which case, in a manner dependent on the potential of the storage nodes $M_1$ and $M_2$, the output signal R of the sense amplifier 6 changes from VSS to VDD, while the signal at the output S of the sense amplifier 6 still remains at VSS. Since the signal at the output R (reset) is now active, the output Q of the flip-flop changes over from VDD to VSS.

At the instant $t_2$, the control signal sel of the N-MOS power switch changes from VDD to VSS, as a result of which the flip-flop is isolated from the supply potential VSS. All the signals illustrated in FIG. 4b, with the exception of the potentials sel, AC and the potentials of the storage nodes $M_1$ and $M_2$, now drift towards VDD. These signals are now no longer defined. As already mentioned above, the control signal AC of the coupling transistors 1a and 1b, while the flip-flop is switched off, still remains at VDD independently of the precharge signal PC. As a result, the storage nodes $M_1$ and $M_2$ are decoupled from the rest of the switched-off flip-flop. The state information of the flip-flop is now stored exclusively by means of the memory cells 4a and 4b.

At the instant $t_3$, the control signal sel of the N-MOS power switch changes again from VSS to VDD; the flip-flop is thus switched on again. Since the precharge signal PC is now at VSS, the sense amplifier 6 is in the evaluate mode and detects the differential voltage across the storage nodes $M_1$ and $M_2$ which has been held since the instant $t_2$. The differential voltage determines the potentials at the output nodes R and S of the sense amplifier 6 and the potentials at the outputs Q and QN of the RS latch stage 10 connected downstream of the sense amplifier 6. In this case, the potentials of the outputs Q and QN correspond to the potentials stored in the storage nodes $M_1$ and $M_2$, respectively, before the instant $t_2$.

At the instant $t_4$, the control signal AC changes from VDD to VSS and the precharge signal PC changes from VSS to VDD. This has the effect that the sense amplifier 6 is changed over again to the precharge mode and, at the same time, the potential of the storage nodes $M_1$ and $M_2$ follows the potential at the data input D and the potential at the inverted data input DN, respectively, that is to say that the flip-flop has resumed its regular operation.

Figure 3B:
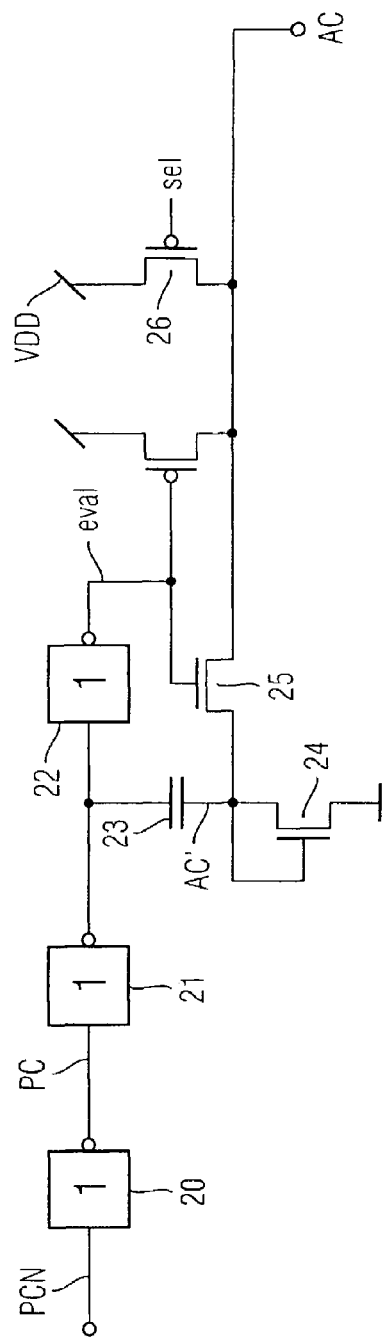
FIG. 3b shows a circuit diagram of the subcircuit for generating the control signals.

FIG. 3b illustrates a circuit for generating the control signals PC, eval and AC. In this case, the circuit is part of the flip-flop illustrated in FIG. 3a, that is to say that each flip-flop has a local circuit for generating the control signals. In the case of multibit registers, such a circuit may also be used for a plurality of flip-flops.

The circuit receives the clock signal PCN and inverts the latter by means of an inverter 20. The output signal PC of the inverter represents the precharge signal PC. By means of two inverters 21 and 22, the temporarily delayed signal eval is generated from the precharge signal PC and can be used instead of the control signal PC for driving the transistors 14a and 14b.

Generally, during active operation, instead of the control signal AC, it is also possible directly to use the inverted precharge signal PCN for driving the coupling transistors 1a and 1b. In order, however, to obtain a high retention time, the potential difference between the two storage nodes $M_1$ and $M_2$ should be as high as possible. For this purpose, it is useful if the coupling transistors 1a and 1b are at the lowest possible resistance during the read-in phase and a Vth voltage drop is avoided. For this purpose, the gate potential of the coupling transistors 1a and 1b is kept less than VSS at least temporarily during the read-in phase. This is also referred to as boosting. A boosting circuit comprising a capacitance 22 and an N-MOS transistor 24 connected as a diode is used for this purpose.

The functioning of the boosting circuit is described below: if the output signal of the inverter 21 is at VDD, the node AC' has the potential $V_{th}$, where $V_{th}$ corresponds to the threshold voltage of the transistor 24. If the output signal of the inverter 21 then changes to VSS=0 V, the voltage across the capacitance 23 is maintained for a short time, so that the potential of the node AC' to a first approximation has the value—(VDD–$V_{th}$). This potential is less than VSS=0 V. If the coupling transistor 25 is at low resistance, the control signal AC has the potential of the node AC'. By contrast, if the signal sel is at VSS, the transistor 26 forces the control signal AC to VDD (cf. FIG. 4b). It should be noted that the additional outlay for the boosting is low since, in a standard-cell-based circuit design, for the purposes of an increased robustness, two inverters are required anyway for the clock signal.

For the error-free functioning of a system that uses the state retention flip-flop according to the invention, it must be presupposed that the maximum switch-off time for a state retention flip-flop according to the invention is shorter than the retention time of the flip-flop. In order, however, also to store the state information over periods of time that are longer than the retention time of the flip-flop, the dynamically stored state information can be repeatedly refreshed as in the case of a DRAM device. In this case, a control circuit reactivates the relevant circuit block momentarily at regular intervals and refreshes the state information contained in the dynamic memory cells of the state retention flip-flop. Control circuits of this type are also referred to as so-called watchdog circuits.

Figure 5:
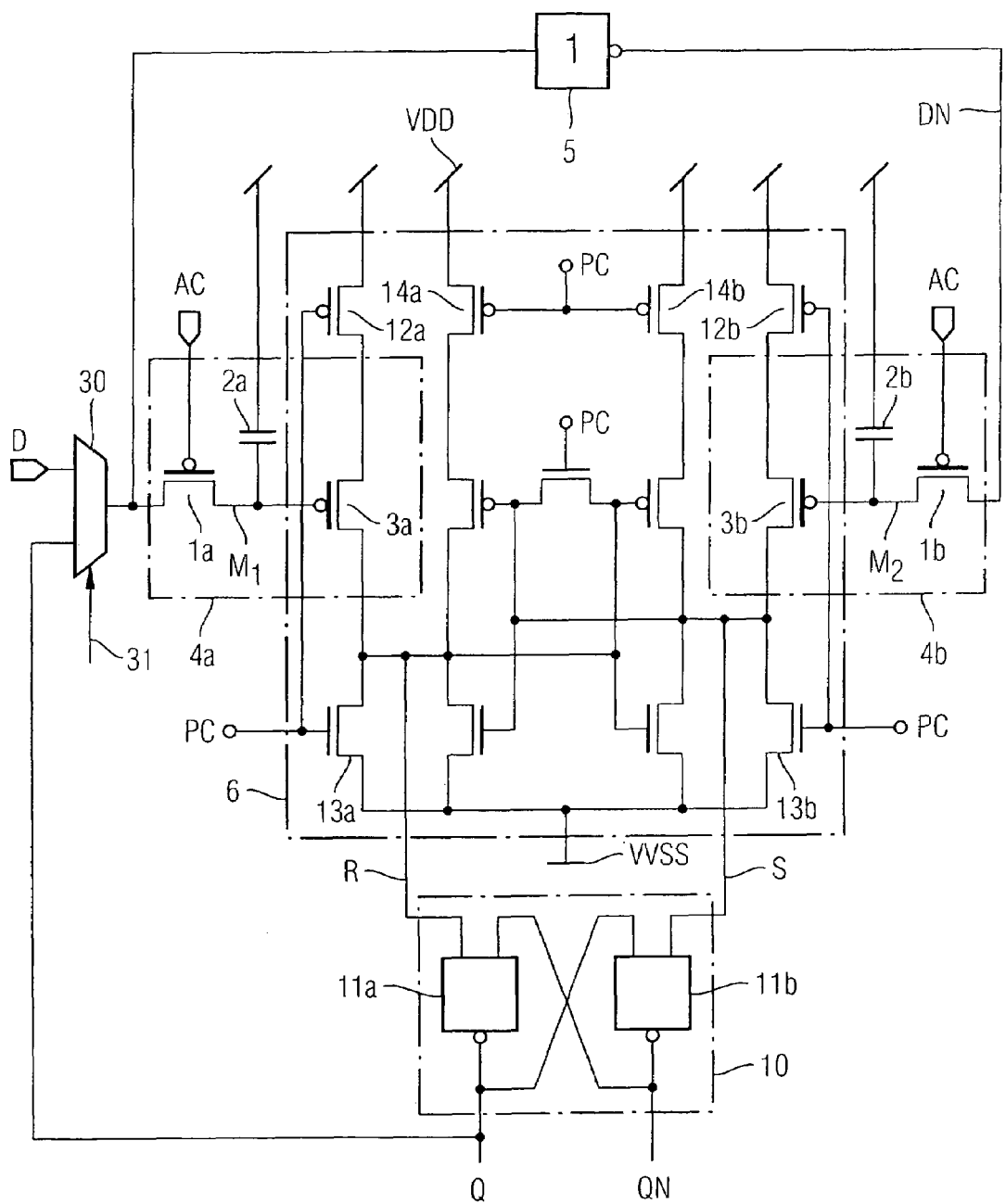
FIG. 5 shows a circuit diagram of a third exemplary embodiment of a flip-flop according to the invention with a 2-to-1 muliplexer.

In order to refresh the state information stored in the dynamic memory cells with a low outlay on circuitry, the flip-flop illustrated in FIG. 3a may be supplemented by an additional 2-to-1 multiplexer 30, which is connected on the input side both to the data input D and to the output Q of the flip-flop. The output of the multiplexer is connected to the memory cells 4a and 4b. FIG. 5 shows the resulting circuit. It should be pointed out that the use of a multiplexer for refreshing a memory cell is not mandatory.

The respective input of the multiplexer 30 is selected by means of a control signal 31: during normal operation, the data input D is connected to the output of the multiplexer 30. When the state information is refreshed, by contrast, the data output Q is connected to the data output of the multiplexer 30.

For refreshing the state information stored in the memory cells 4a and 4b, the flip-flop is switched on momentarily and the storage content of the memory cells 4a and 4b is read out via the sense amplifier 6. The state information is output at the output Q of the flip-flop and written back to the memory cells 4a and 4b again via the multiplexer 30. After the refresh, the flip-flop can be switched off again.

It is evident that refreshing the state information is associated with an additional energy consumption. Since a minimum turn-off time that is expedient from an energy standpoint is in the range of a few microseconds, but it is possible to realize retention times in the range of a few milliseconds to hundred milliseconds, the additional energy consumption can be disregarded.

The state information can be refreshed at a specific, fixed temporal repetition rate. As an alternative, the refresh may be controlled by monitoring a monitor memory cell which is part of a monitor circuit according to the invention.

A basic concept when using a monitor memory cell is that the discharge behaviour of the monitor memory cell in the monitor circuit corresponds to the discharge behaviour of a memory cell in a state retention flip-flop according to the invention if both memory cells are identical. It also follows from this, however, that the temperature and batch dependence of the leakage currents and of the retention time are approximately identical for the monitor circuit and for a state retention flip-flop of analogous construction.

In addition to the above-described first application of the refresh control, a monitor circuit may furthermore be used in a second application scenario to ascertain whether the stored state information in flip-flops according to the invention in a circuit block is still valid after the circuit block is switched on again, or has already been erased on account of an excessively long switch-off time. If, after being switched on again, the monitor circuit signals that the case mentioned last is present, the system has to be restarted after the process of switching on again.

As a third application scenario, it is conceivable in the sense of the invention that both short and long turn-off phases may occur in a system. In this case, a monitor circuit may be used to distinguish between a short and a long turn-off phase. As standard the system is turned off only for a short turn-off phase. If a circuit block in the system is not switched on at the correct time, the storage content of the flip-flops contained in the circuit block threatens to be lost. This can be identified by a monitor circuit. In this case, the state information stored in the flip-flops can be swapped into a circuit-block-external memory (for example an SRAM).

Figure 6:
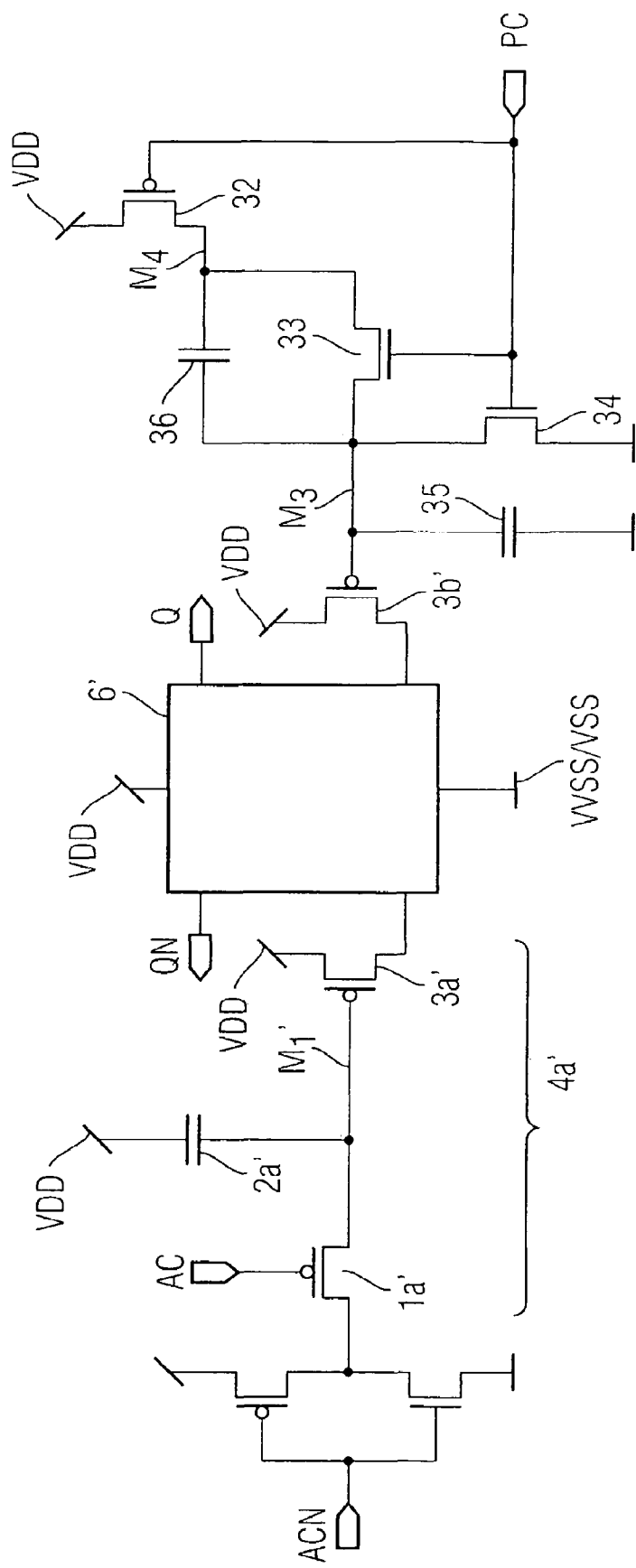
FIG. 6 shows a circuit diagram of an exemplary embodiment of a monitor circuit according to the invention in the form of a monitor flip-flop.

FIG. 6 illustrates a circuit diagram of an exemplary embodiment of a monitor circuit according to the invention, which comprises a monitor memory cell 4a. The monitor circuit illustrated in FIG. 6 is based on the flip-flop in accordance with FIG. 2. The components and signals in FIG. 6 that are provided with reference symbols that have an added prime but are otherwise identical correspond to the components and signals provided with reference symbols that do not have an added prime in FIG. 2.

In the case of the monitor circuit illustrated in FIG. 6, the critical storage state of a memory cell in a state retention flip-flop is simulated in the monitor memory cell 4a'. In this case, the potential at the storage node $M_1'$ of the monitor memory cell 4a' is compared with a reference potential of the node $M_3$. A differential sense amplifier 6' is provided for carrying out the comparison. In this case, the reference potential is dimensioned such that the decision of the sense amplifier 6' has a sufficient margin of certainty.

The reference potential at the node $M_3$ is generated by means of a capacitive voltage divider comprising the capacitances 35 and 36. In this case, the reference potential $M_3$ represents a fraction of the supply potential VDD, for example 0.25·VDD. The lower the reference potential, the more certain the decision of the sense amplifier 6'. Furthermore, three MOS transistors 32, 33 and 34 are provided, which reset the potential of the node $M_3$ and of the node $M_4$ to VSS during the precharge mode (PC=VDD) of the sense amplifier 6 in order to avoid non-defined potentials for these nodes. For this purpose, the gate terminals of the three MOS transistors 32, 33 and 34 are driven by the precharge signal PC.

In order to generate a storage state in the monitor memory cell 4a', firstly the node $M_1'$ is charged to VSS via the coupling transistor 1a' (AC=VSS; ACN=VDD). When the circuit block to be monitored is switched off, the monitor circuit is also switched off for the second application scenario (that is to say use of VVSS as negative supply potential). In the switched-off state, the potential of the node $M_1'$ slowly drifts in the direction of VDD proceeding from VSS. After the circuit block and the monitor circuit are switched on again, the potential of the node $M_1'$ is compared with the reference potential of the node $M_3$. Depending on the comparison, the output Q of the sense amplifier 6' toggles either to VDD or VSS. If, during the switch-off phase, the content of the memory cell was destroyed to the extent that the potential of the node $M_1'$ (for example 0.60·VDD) is greater than the reference potential of the node $M_3$ (for example 0.25·VDD), then the output Q of the sense amplifier 6' toggles to VDD. Otherwise, the output Q of the sense amplifier 6' toggles to VSS.

The monitor circuit is not concomitantly turned off for the first and third application scenarios (that is to say use of VSS instead of VVSS as negative supply potential). Instead, the input of the memory cell is put at the opposite potential to which it was charged previously. The leakage currents into the memory cell are maximal in this way. The sense amplifier 6' is used to periodically compare the present voltage on the storage capacitance 2a' with the reference voltage. If the charge on the storage capacitance 2a' has been destroyed by leakage currents to such an extent that the sense amplifier 6' toggles in the incorrect direction, this is the signal for the system to switch the circuit block on again and to refresh the flip-flops again (first application scenario) or to swap the storage content into a circuit-block-external memory (third application scenario).

Figure 7:
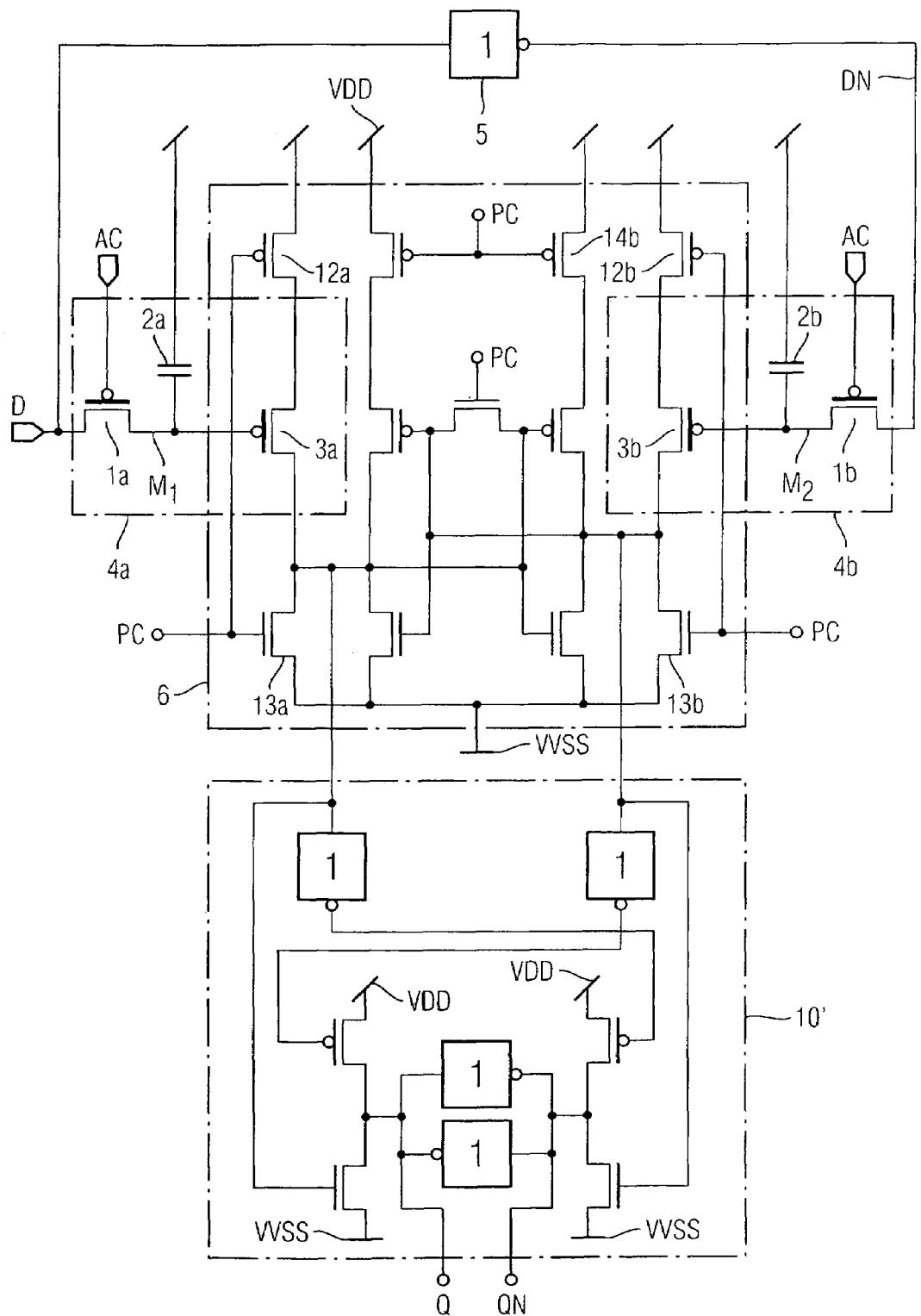
FIG. 7 shows a circuit diagram of a fourth exemplary embodiment of a flip-flop according to the invention.

FIG. 7 illustrates a circuit diagram of an exemplary embodiment of a flip-flop according to the invention which constitutes an alternative to that of FIG. 3a. The components and signals provided with identical reference symbols in FIG. 3a and FIG. 7 correspond to one another. Instead of a NOR-RS latch stage 10 as in FIG. 3a, in FIG. 7 a simple inverter latch stage 10' is used as a slave latch stage. The outputs are driven in accordance with the push-pull principle.

Finally, it should be pointed out that, in the case of the state retention flip-flop according to the invention, it is necessary to make a compromise between a longest possible retention time and a shortest possible charging time, and thus highest possible clock rate, since these two parameters are related in competition with one another. The retention time can in principle be chosen to be as high as desired by means of correspondingly high capacitance values. Conversely, however, it also holds true that large capacitance values are associated with a correspondingly high charging time, so that the maximum clock rate of the flip-flop is correspondingly low. Consequently, there is a maximum ratio between the retention time and the charging time which determines the minimum period duration of the clock signal. This ratio is determined by the properties of the coupling transistor. It can be shown that the retention time and the charging time are in the following relationship with respect to one another:

$$\frac{T_R}{T_C} = \frac{I_{sat}}{I_{leak}}$$

In this case, the parameter $T_R$ denotes the retention time, the parameter $T_C$ denotes the charging time, the parameter $I_{sat}$ denotes the saturation current in the switched-on state of the coupling transistor, and the parameter $I_{leak}$ denotes the leakage current in the switched-off state of the coupling transistor. Values in the range of $10^6$ to $10^7$ can be realized for the ratio between $I_{sat}$ and $I_{leak}$. Since typical values for the turn-off time and thus for the required retention time lie in the microseconds range, very high clock rates can be ensured.

While the foregoing is directed to embodiments of the present invention, other and further embodiments of the invention may be devised without departing from the basic scope thereof, and the scope thereof is determined by the claims that follow.

What is claimed is:

1. A flip-flop for storing an item of logic state information, comprising:
   at least one data input and at least one data output;
   at least one latch stage for storing the state information if the flip-flop is switched on; and
   at least one memory cell having a capacitive storage element for storing the state information if the flip-flop is switched off, wherein the at least one memory cell further comprises:
   a MOS storage transistor driven via the capacitive storage element; and
   a MOS coupling transistor which, responsive to a first control signal, is configured to:
   electrically couple the capacitive storage element to the data input; and
   electrically decouple the capacitive storage element from the data input.

2. The flip-flop of claim 1, wherein the flip-flop is switched on and off in a manner dependent on a second control signal and the first control signal is dependent on the second control signal so that the capacitive storage element is electrically decoupled from the data input if the flip-flop is switched off by according to the second control signal.

3. The flip-flop of claim 1, wherein at least one of the coupling transistor and the storage transistor are thick oxide MOS transistors.

4. The flip-flop of claim 1, wherein at least one of the coupling transistor and the storage transistor are high threshold transistors.

5. The flip-flop of claim 1, wherein at least one of the coupling transistor and the storage transistor are P-MOS transistors.

6. The flip-flop of claim 5, wherein:
   a gate terminal of the coupling transistor is driven by the first control signal;
   a source terminal of the coupling transistor receives the first control signal at the data input;
   a drain terminal of the coupling transistor is connected to the capacitive storage element;
   a gate terminal of the storage transistor is connected to the capacitive storage element; and
   a drain terminal of the storage transistor is connected to the latch stage.

7. The flip-flop of claim 5, wherein the coupling transistor is a P-MOS transistor and the first control signal that drives the gate terminal of the coupling transistor, while the capacitive storage element is electrically coupled to the data input, is at least temporarily less than the potential of a negative pole of the supply voltage.

8. The flip-flop of claim 7, wherein, when the flip-flop is switched off: the flip-flop is isolated from one of the positive pole and the negative pole of the supply voltage, and, conversely, the capacitive storage element is electrically connected to the respective negative pole or positive pole of the supply voltage.

9. The flip-flop of claim 5, wherein the coupling transistor is a N-MOS transistor and the first control signal that drives the gate terminal of the coupling transistor, while the capacitive storage element is electrically coupled to the data input, is at least temporarily greater than the potential of a positive pole of the supply voltage.

10. The flip-flop of claim 9, wherein, when the flip-flop is switched off: the flip-flop is isolated from one of the positive pole and the negative pole of the supply voltage, and, conversely, the capacitive storage element is electrically connected to the respective negative pole or positive pole of the supply voltage.

11. A flip-flop for storing an item of logic state information, comprising:
    at least one data input and at least one data output;
    at least one latch stage for storing the state information if the flip-flop is switched on;
    at least one memory cell having a capacitive storage element for storing the state information if the flip-flop is switched off; and
    a multiplexer having an input side for receiving a signal at the data input and for receiving the state information stored in the at least one memory cell, and furthering having an output side connected to an input of the at least one memory cell.

12. A flip-flop for storing an item of logic state information, comprising:
    at least one data input and at least one data output;
    at least one latch stage for storing the state information if the flip-flop is switched on;
    a first memory cell having a first capacitive storage element for storing the state information if the flip-flop is switched off; and
    a second memory cell having a second capacitive storage element for storing the state information if the flop-flop is switched off, wherein
    an inverter is coupled between the first memory cell and the second memory cell.

13. A flip-flop for storing an item of logic state information, comprising:
- at least one data input and at least one data output;
- at least one latch stage for storing the state information if the flip-flop is switched on; and
- at least one DRAM memory cell having a capacitive storage element for storing the state information if the flip-flop is switched off.

14. A sense-amplifier-based flip-flop for storing an item of logic state information, comprising:
- at least one data input and at least one data output;
- a sense amplifier comprising a function as a static latch stage for storing the state information if the sense-amplifier-based flip-flop is switched on; and
- at least one memory cell having a capacitive storage element for storing the state information if the sense-amplifier-based flip-flop is switched off.

* * * * *